United States Patent
Diehl et al.

(10) Patent No.: US 7,286,976 B2
(45) Date of Patent: Oct. 23, 2007

(54) EMULATION OF CIRCUITS WITH IN-CIRCUIT MEMORY

(75) Inventors: Philippe Diehl, Versailles (FR); Gilles Laurent, Boulogne (FR); Frederic Reblewski, Paris (FR)

(73) Assignee: Mentor Graphics (Holding) Ltd., Wilsonville, OR (US)

( * ) Notice: Subject to any disclaimer, the term of this patent is extended or adjusted under 35 U.S.C. 154(b) by 613 days.

(21) Appl. No.: 10/458,176

(22) Filed: Jun. 10, 2003

(65) Prior Publication Data

US 2004/0254780 A1 Dec. 16, 2004

(51) Int. Cl.
*G06F 9/455* (2006.01)

(52) U.S. Cl. ............... 703/23; 703/24; 703/25; 703/28; 713/200; 713/400; 713/401; 713/2; 716/1; 716/7

(58) Field of Classification Search ............... 703/23, 703/25, 24, 28; 713/400, 200, 401, 2; 716/1, 716/7; 711/219; 714/725
See application file for complete search history.

(56) References Cited

U.S. PATENT DOCUMENTS

| | | | |
|---|---|---|---|
| 5,036,473 A | | 7/1991 | Butts et al. |
| 5,109,353 A | | 4/1992 | Sample et al. |
| 5,649,176 A | * | 7/1997 | Selvidge et al. ............ 713/400 |
| 5,777,489 A | | 7/1998 | Barbier et al. |
| 5,821,773 A | | 10/1998 | Norman et al. |
| 5,854,752 A | * | 12/1998 | Agarwal ........................ 716/7 |
| 5,970,240 A | * | 10/1999 | Chen et al. ................... 703/25 |
| 6,009,531 A | * | 12/1999 | Selvidge et al. ............ 713/400 |
| 6,184,707 B1 | | 2/2001 | Norman et al. |
| 6,265,894 B1 | | 7/2001 | Reblewski et al. |
| 6,463,529 B1 | * | 10/2002 | Miller et al. ................... 713/2 |
| 6,473,726 B1 | | 10/2002 | Reblewski |
| 6,539,467 B1 | * | 3/2003 | Anderson et al. ........... 711/219 |
| 6,694,464 B1 | * | 2/2004 | Quayle et al. .............. 714/725 |

(Continued)

FOREIGN PATENT DOCUMENTS

EP 0 651 343 5/1995

(Continued)

OTHER PUBLICATIONS

Quaiss et al., "Efficient resource arbitration in reconfigurable computing environments", ACM 2000.*

(Continued)

*Primary Examiner*—K. Thangavelu
(74) *Attorney, Agent, or Firm*—Banner & Witcoff, Ltd.

(57) ABSTRACT

Methods and apparatuses for emulating a circuit design that includes an in-circuit memory. Sets of reconfigurable logic resources are configured to emulate a logic element of a circuit, where the circuit may include a plurality of logic elements. A memory resource is configured to emulate a portion of the in-circuit memory. Reconfigurable interconnect resources are configured to interconnect the sets of configurable logic resources to the memory resource by way of a memory access arbiter. The memory access arbiter is configured to arbitrate and serialize accesses for the memory resource by the sets of reconfigurable logic resources in an emulation cycle, in accordance with associated priority levels. The priority level of the set of reconfigurable logic resources may be dependent on timing requirements of the set of reconfigurable logic resources and on timing characteristics of the associated logic element of the circuit.

26 Claims, 11 Drawing Sheets

U.S. PATENT DOCUMENTS

| | | | |
|---|---|---|---|
| 6,697,957 B1* | 2/2004 | Wang et al. | 713/401 |
| 6,732,068 B2* | 5/2004 | Sample et al. | 703/24 |
| 2001/0011353 A1* | 8/2001 | Little et al. | 713/200 |
| 2003/0074178 A1* | 4/2003 | Sample et al. | 703/25 |
| 2004/0078187 A1* | 4/2004 | Reblewski | 703/28 |
| 2006/0117274 A1* | 6/2006 | Tseng et al. | 716/1 |

FOREIGN PATENT DOCUMENTS

| | | |
|---|---|---|
| WO | WO 94/06210 | 3/1994 |

OTHER PUBLICATIONS

Wu et al., "Fault detection and location of dynamic reconfigurable FPGAs", IEEE, 1999.*

Antoni et al., "Using run-time reconfiguration for fault injection in hardware prototypes", IEEE 2002.*

Antoni et al., "Dependabilty analysis: a new application for run-time reconfiguration", IEEE 2003.*

Nitsch et al., "Embedded system architecture design based on real-time emulation", IEEE 2000.*

Englert et al., "Graceful quorum reconfiguration in a robust emulation of shared memory", IEEE 2000.*

GajjalaPurna et al., "Emulating large designs on small reconfigurable hardware", IEEE 1998.*

Hayashi et al., "Reconfigurable real-time signal transport system using custom FPGs", IEEE 1995.*

Pirola et al., "A solution for hardware emulation of non volatile memory macrocells", IEEE 2003.*

Noguera et al., "Run-time HW/SW codesign for discrete event systems using dynamically reconfigurable architectures", IEEE 2000.*

Charles Clos, "A Study of Non-Blocking Switching Networks", The Bell System Technical Journal, Mar. 1953, pp. 406-424.

Werner Erhard et al., "First Steps towards a Reconfigurable Asynchronous System", Friedrich-Schiller University Jena, Department of Computer Science, IEEE International Workshop on Rapid System Prototyping, Jun. 1999, pp. 28-31.

Fatih Kocan et al., "Concurrent D-Algorithm on Reconfigurable Hardware", IEEE 1999, pp. 152-155.

Jack Jean et al., "Dynamic Reconfiguration to Support Concurrent Applications", IEEE Transactions Of Computers, vol. 48, No. 6, Jun. 1999, pp. 591-602.

Bernard Bosi et al., "Reconfigurable Pipelined 2-D Convolvers for Fast Digital Signal Processing", IEEE Transactions on Very Large Scale Integration (VLSI) Systems, vol. 7, No. 3, Sep. 1999, pp. 299-308.

A. Ejnioui et al., "Design Partitioning on Single-Chip Emulation Systems", Center for Microelectronics Research, Dept. of CSE, University of South Flordia, 13th International Conference on VLSI Design, 2000, pp. 234-239.

Greg Snider, "The Teramac Compiler", Hewlett-Packard, 1996, pp. 1-51.

Xilinix, "Programmable Gate Array Design Handbook", First Edition, 1986, pp. i-A10.

Jonathan Babb, et al., "Logic Emulation with Virtual Wires", IEEE Transactions on Computer-Aided Design of Integrated Circuits and Systems, Jun. 1997, pp. 1-20.

* cited by examiner

EMULATION OF CIRCUITS WITH IN-CIRCUIT MEMORY

FIELD OF THE INVENTION

The present invention relates to the field of emulation of electronic circuits. More specifically, the present invention relates to emulation components having memory resources.

BACKGROUND OF THE INVENTION

Today, relatively large integrated circuit (IC) designs are common as exemplified by the expanding growth of System on Chip (SOC) designs. In-circuit memory elements, e.g. memory devices, are prevalent in such designs. Memory configurations in an electronic circuit may vary from a limited number of large-sized memory elements to numerous small-sized memory elements. In an emulation of an electronic circuit design, emulating in-circuit memory elements may present challenges to an engineer. For example, an emulation system, which provides reconfigurable logic resources and memory resources to emulate the electronic circuit, may have a relatively small number of emulation ICs. Moreover, an emulation IC has limited memory resources. A memory resource may support the emulation of a plurality of memory elements of the electronic circuit. Thus, the emulation system may support the emulation of a number of memory elements with a smaller number of memory resources. Consequently, different memory elements may compete for a same memory resource during an emulation cycle.

Multiple timing domains in the electronic circuit design may further exacerbate associated problems when emulating multiple memory elements in a single emulation memory. For example, in an electronic circuit design, a first in-circuit memory element may reside in a first logic block that operates under a first timing domain. A second in-circuit memory element may reside in a second logic block that operates under a second timing domain. It is possible to have a single emulation memory resource service access requests for both memory elements during an emulation cycle of the electronic circuit. However, an access request from the second logic block (associated with the second timing domain) may arrive asynchronously with respect to a clock signal of the first timing domain (associated with the first logic block.)

The market trend in the semiconductor industry is for integrated circuits to become larger and more complex. Thus, there is a real market need to facilitate an emulation of an electronic circuit that may have an inordinate degree of memory complexity while the emulation system may have limited memory resources.

BRIEF SUMMARY

Aspects of the present invention provide for emulation of circuit designs that include in-circuit memory. Sets of reconfigurable logic resources may be configured to emulate logic elements of an electronic circuit design, where the circuit design may include a plurality of logic elements. One or more memory resources may be configured to emulate a portion of an in-circuit memory of the circuit design. Reconfigurable interconnect resources may be configured to interconnect the sets of configurable logic resources to the memory resource by way of a memory access arbiter. The memory access arbiter may be configured to arbitrate and/or serialize accesses to the memory resource by the sets of reconfigurable logic resources in an emulation cycle. Such arbitration and/or serialization may be in accordance with priority levels associated with the sets of reconfigurable logic resources. The priority level of a set of reconfigurable logic resources may be dependent on timing requirements of the set of reconfigurable logic resources and/or on timing characteristics of the associated logic elements of the circuit design.

According to further aspects of the invention, the memory access arbiter may include arbitration logic and/or a plurality of registers that indicate priority levels of corresponding sets of reconfigurable logic resources to the arbitration logic. The arbitration logic may determine a designated set of reconfigurable logic resources and/or grant access of memory resource to the set of reconfigurable logic resources that has the highest priority level.

According to further aspects of the invention, the memory access arbiter may include arbitration logic and/or a plurality of counters that indicate priority levels of corresponding sets of reconfigurable logic resources (which may reside, in the same or different timing domains) to the arbitration logic. A priority level may be determined by a current count of an associated counter. Each counter may be initialized to an initial value, where initial values of the counters may be identical or may be different. The counters may be incremented uniformly or non-uniformnly in concert with a system clock. When a memory resource is available, the arbitration logic may grant access to a designated set of reconfigurable logic resources that is associated with the counter having the largest count.

In accordance with still further aspects of the invention, priority levels may be determined by a composite measure that may utilize, an associated count and/or an associated register value. However, a composite measure that encompasses other priority components may be used.

BRIEF DESCRIPTION OF THE DRAWINGS

Elements in the drawings are illustrated by way of example. The drawings are not intended to limit the scope of the present invention.

DETAILED DESCRIPTION OF ILLUSTRATIVE EMBODIMENTS

Figure 1:
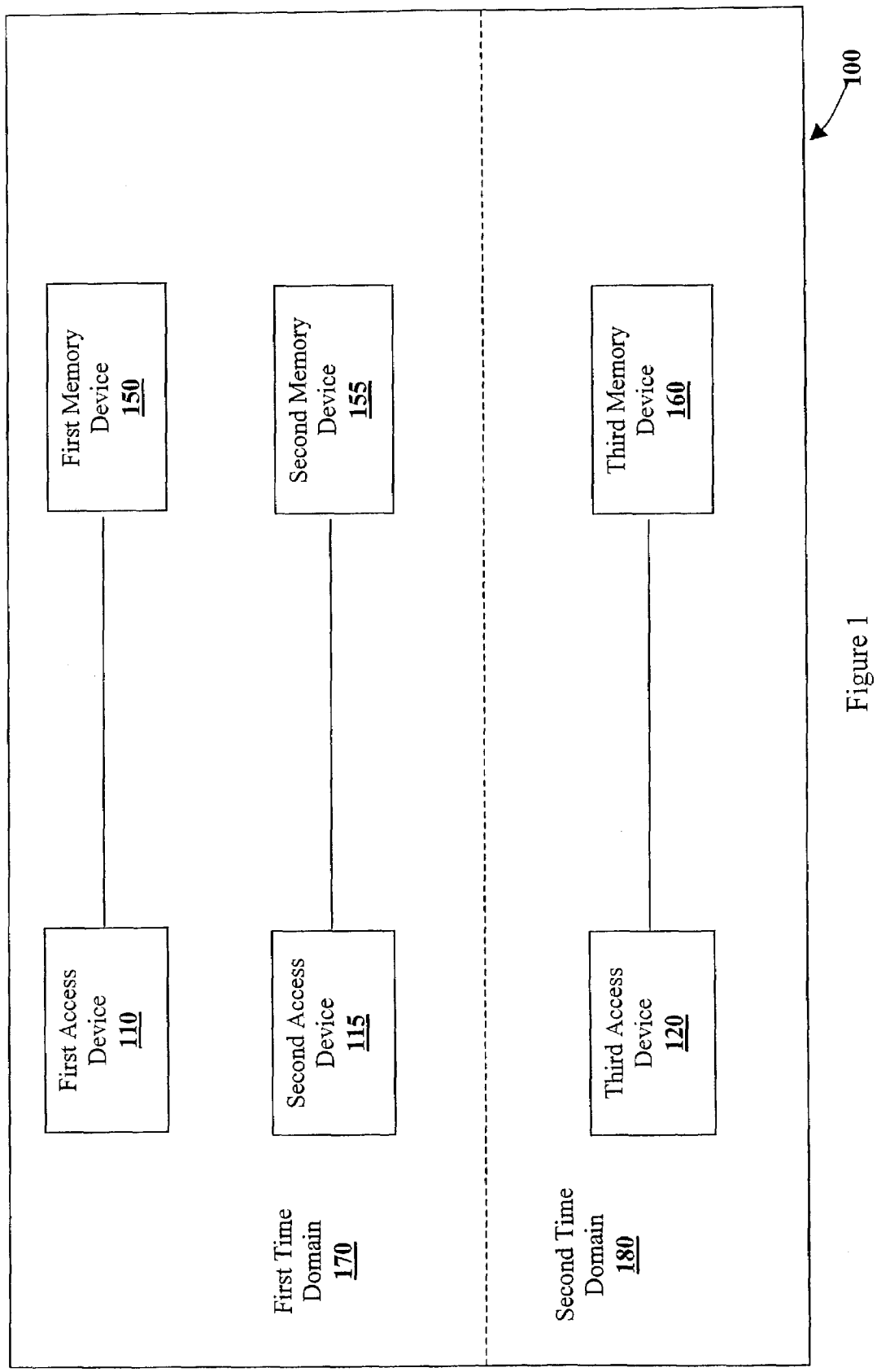
FIG. 1 is a functional block diagram of an illustrative circuit design having a plurality of in-circuit memory devices in accordance with at least one aspect of the invention.

FIG. 1 is a functional block diagram of an illustrative circuit design 100 comprising in-circuit memory devices 150, 155, and 160. The in-circuit memory devices 150, 155, and 160 may be memory devices that are embedded into a circuit and used by other elements of the circuit. The in-circuit memory device, for example, may be a highly specialized Dynamic Random Access Memory (DRAM) intellectual property (IP) component or a static random access memory (SRAM) memory device. Access devices 110, 115, and 120 and the memory devices 150, 155, and 160 are shown as part of the circuit design 100. Each access device 110, 115, and 120 comprises at least one logic element. During operation, the logic elements access at least one memory device 150, 155, and 160. For example, as shown in FIG. 1, the first access device 110, which resides in a first timing domain 170, accesses the first memory device 150. The second access device 115, which is also in the first timing domain, accesses the second memory device 155. The third access device 120 accesses the third memory device 160. However, the third memory device 120 resides in a second timing domain 180 in the example shown in FIG. 1.

Figure 2:
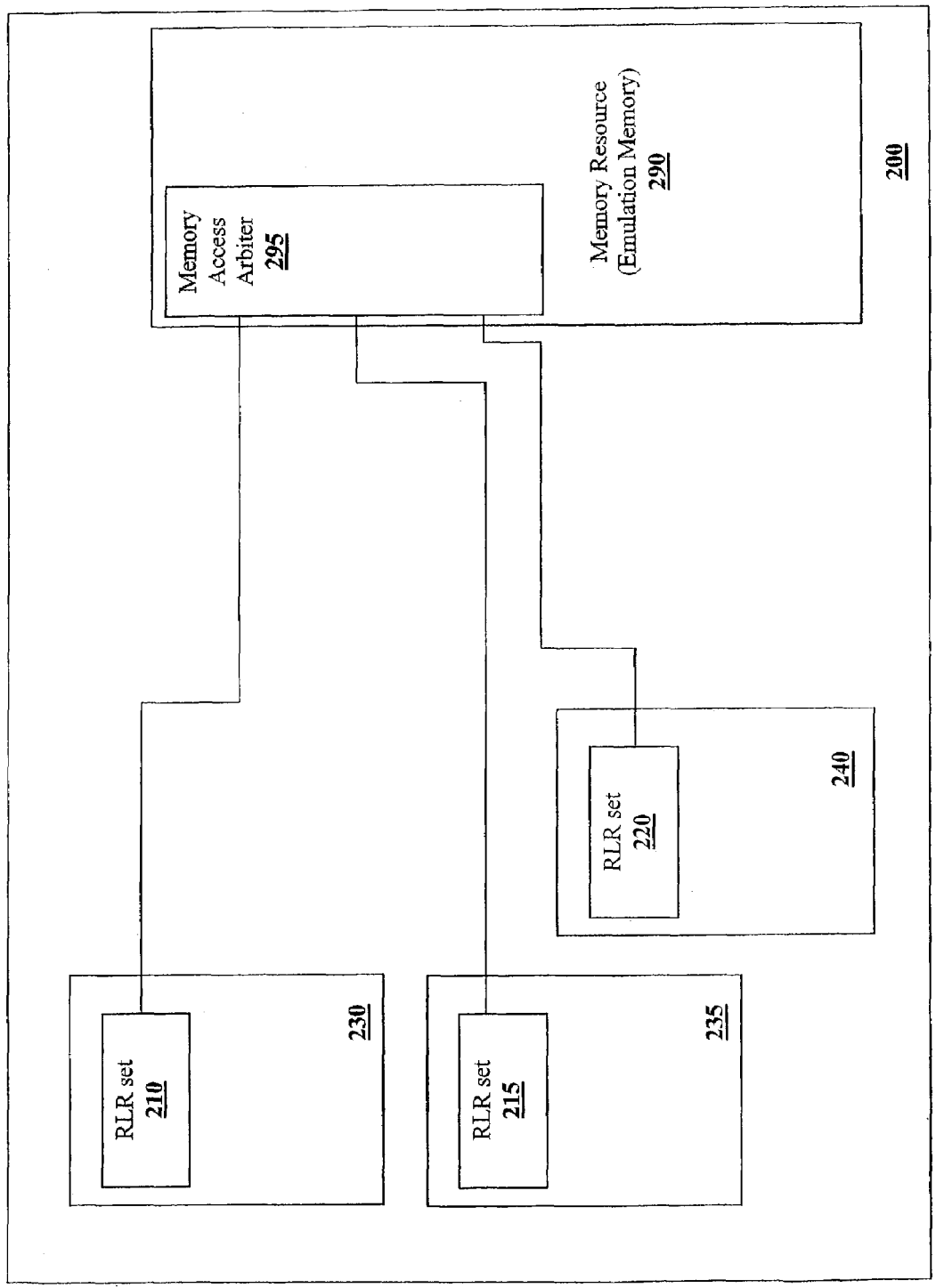
FIG. 2 is a functional block diagram of an illustrative emulation system used to emulate the circuit design of FIG. 1, in accordance with at least one aspect of the invention.

FIG. 2 illustrates a block diagram of an illustrative emulation system 200 used to emulate the circuit design 100 as shown in FIG. 1, in accordance with one embodiment. The emulation system 200 includes an emulation memory resource 290. The emulation system 200 shows three blocks of reconfigurable logic resources (RLRs) 230, 235, and 240. Each block of reconfigurable logic resources (230, 235, and 240) comprises at least a subset of reconfigurable logic resources 210, 215, and 220 respectively, which are configured to operate as user access devices, where each subset of reconfigurable logic resources 210, 215, 220 has at least one reconfigurable logic resource. The first set of reconfigurable logic resources 210 is configured to emulate the first access device 110. The second set of reconfigurable logic resources 215 is configured to emulate the second access device 115. The third set of reconfigurable logic resource 220 is configured to emulate the third access device 120. Access arbiter 295 may allow access to the emulation memory resource 290 by the set of reconfigurable logic resources 210, 215, and 220. In the illustrative embodiment, the memory access arbiter 295 includes reconfigurable logic resources that are configured to function in the manner described herein. Alternatively, the memory access arbiter 295 may be an integrated companion emulation feature of an embedded memory of a special purpose emulation IC.

As noted in the discussion of FIG. 1, the illustrative circuit design 100 includes the memory devices 150, 155, and 160. However, in the emulation of the circuit design 100, the single memory resource 290, may be used to emulate all three of the memory devices 150, 155, 160. Of course, more than one memory resource 290 may be used. In the electronic circuit 100, as shown in FIG. 1, more than one of the access devices 110, 115, and 120 may, at a given instance of time, attempt to concurrently access the associated memory devices 150, 155, and 160. However in the emulation system scenario as shown in FIG. 2, where the single emulation memory resource 290 emulates a plurality of memory devices 150, 155, and 160 and where there are concurrent accesses to each of the memory devices of the circuit design, an arbitration scheme may be required to arbitrate accesses to the single emulation memory resource 290.

Figure 3:
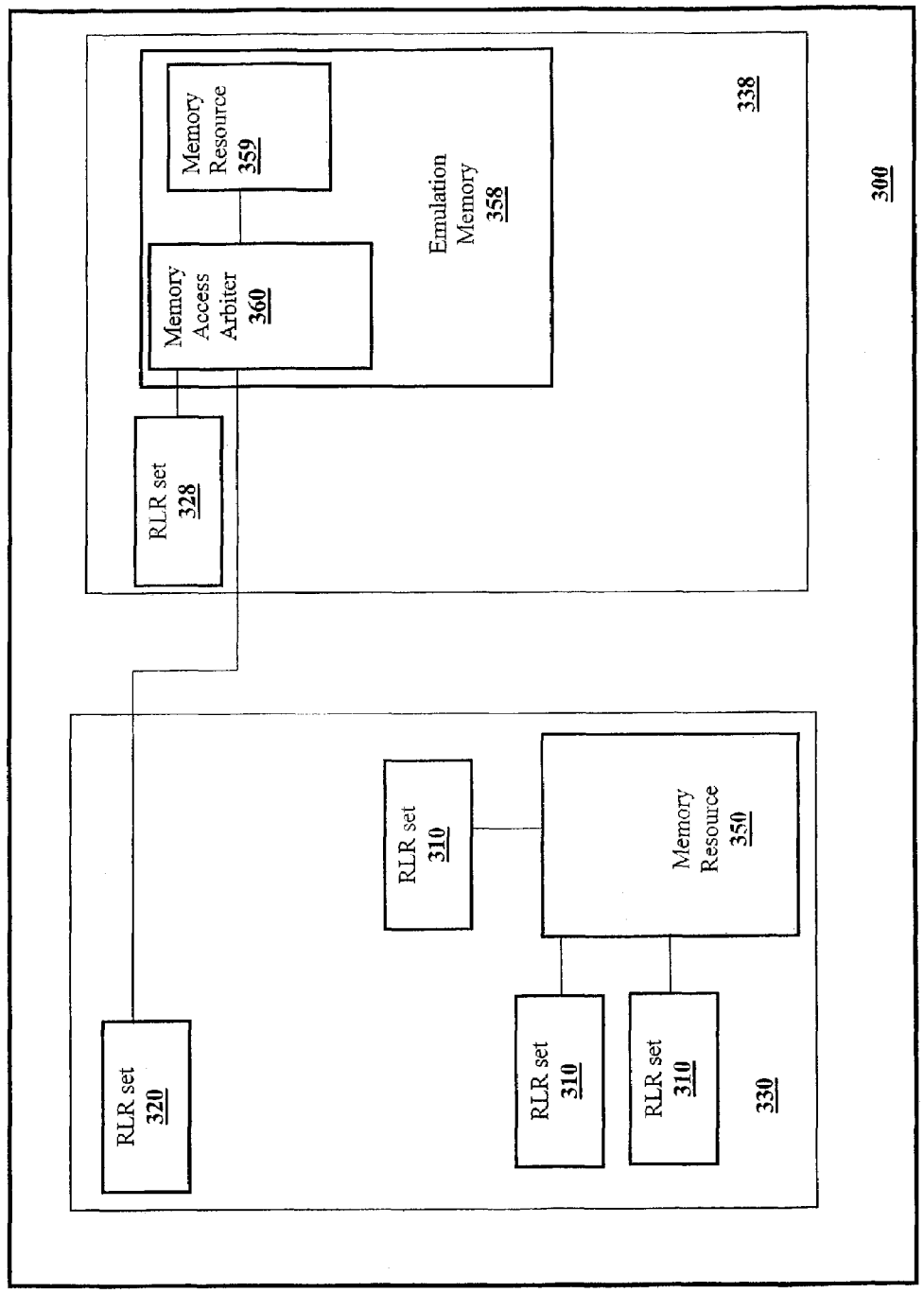
FIG. 3 is a functional block diagram of a portion of an illustrative emulation system having a memory access arbiter, in accordance with at least one aspect of the invention.

FIG. 3 illustrates a block diagram of a portion of an illustrative emulation system 300 that includes a memory access arbiter 360. In the emulation system 300, integrated circuits 330 and 338 each include sets of reconfigurable logic resources 310, 320, and 328. Each set of reconfigurable logic resources 310, 320, and 328 is configured to emulate one or more logic elements of an electronic circuit design. In addition, the sets of reconfigurable logic resources 310, 320, and 328 utilize memory elements (not shown), e.g. memory devices, in the electronic circuit design. The memory elements in the electronic circuit design are emulated by memory resources 350 and 359 on the integrated circuits 330 and 338, respectively. The set of reconfigurable logic resources 328 utilizes the memory resource 359 in the integrated circuit 338. In the embodiment shown, the set of reconfigurable logic resources 320 in the integrated circuit 330 also utilizes the memory resource 359. The utilization of the memory resource 359 in the integrated circuit 338 occurs even though the memory resource 350 is in the integrated circuit 330. In the embodiment shown, the memory resource 350 is fully utilized by the reconfigurable logic resources 310. As a result the memory resource 350 is not able to service the memory requirements of the set of reconfigurable logic resources 320. Thus, when the circuit design is partitioned for emulation in the emulation system 300, the memory resource 359 is configured to emulate memory accessed by the set of reconfigurable logic resources 320.

Figure 4:
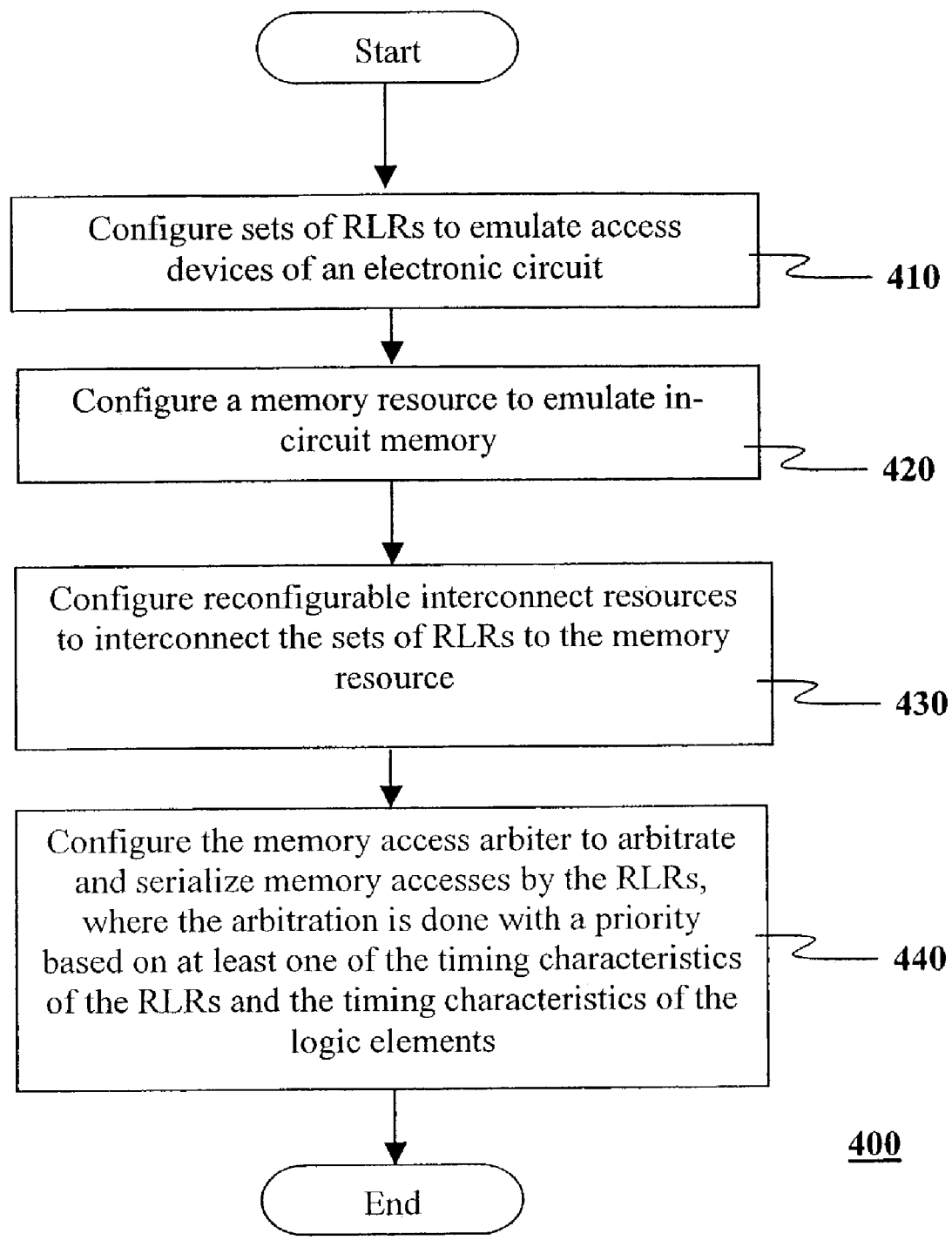
FIG. 4 is a flow diagram showing illustrative steps for configuring memory resources of an emulator to facilitate emulation of an electronic circuit comprising embedded memory, in accordance with at least one aspect of the invention.

FIG. 4 illustrates an illustrative flow diagram 400 for configuring resources of an emulation system to facilitate emulation of a circuit design comprising embedded memory. In this embodiment, sets of reconfigurable logic resources are configured to emulate access devices of a circuit design at step 410. For example, at least one logic resource may correspond to the first access device 110, as shown in FIG. 1. A memory resource in the emulator 200 or 300 is configured to emulate in-circuit memory of the electronic circuit, at step 420. In step 430, reconfigurable interconnect resources are configured to interconnect the sets of reconfigurable logic resources to the memory resource. In one embodiment, where the sets of reconfigurable logic resources reside on the same emulation integrated circuit as the memory resource, reconfigurable interconnect logic of the emulation integrated circuit may be used to interconnect the sets reconfigurable logic resources to the memory resource. In another embodiment, if at least one set of reconfigurable logic resources originates from a different emulation integrated circuit than an integrated circuit having the memory resource and is interconnected to the memory resource, then additional interconnect resources in the integrated circuit containing the reconfigurable logic resources, in the integrated circuit containing the memory resource, and/or in separate interconnect resources in one or more separate integrated circuits may be used to interconnect the reconfigurable logic resources with the memory resource. The interconnect logic may also utilize a memory access arbiter. The memory access arbiter receives memory access requests from the reconfigurable logic resources and arbitrates and/or serializes accesses for the memory resource by the two sets of reconfigurable logic resources, at step 440. Arbitration may utilize a priority level that is associated with each subset of reconfigurable logic resources. Each associated priority level may be based upon at least one of two considerations. A first consideration is the timing characteristics of the respective subset of reconfigurable logic resources that are requesting access. For example, in one embodiment, the priority level of a subset of reconfigurable logic references is based upon of the location of the subset of reconfigurable logic resources in an emulation integrated circuit, in accordance with the timing requirements of the emulation resources. A second consideration is the timing characteristics of the logic elements of the electronic circuit design that are being emulated.

Figure 5:
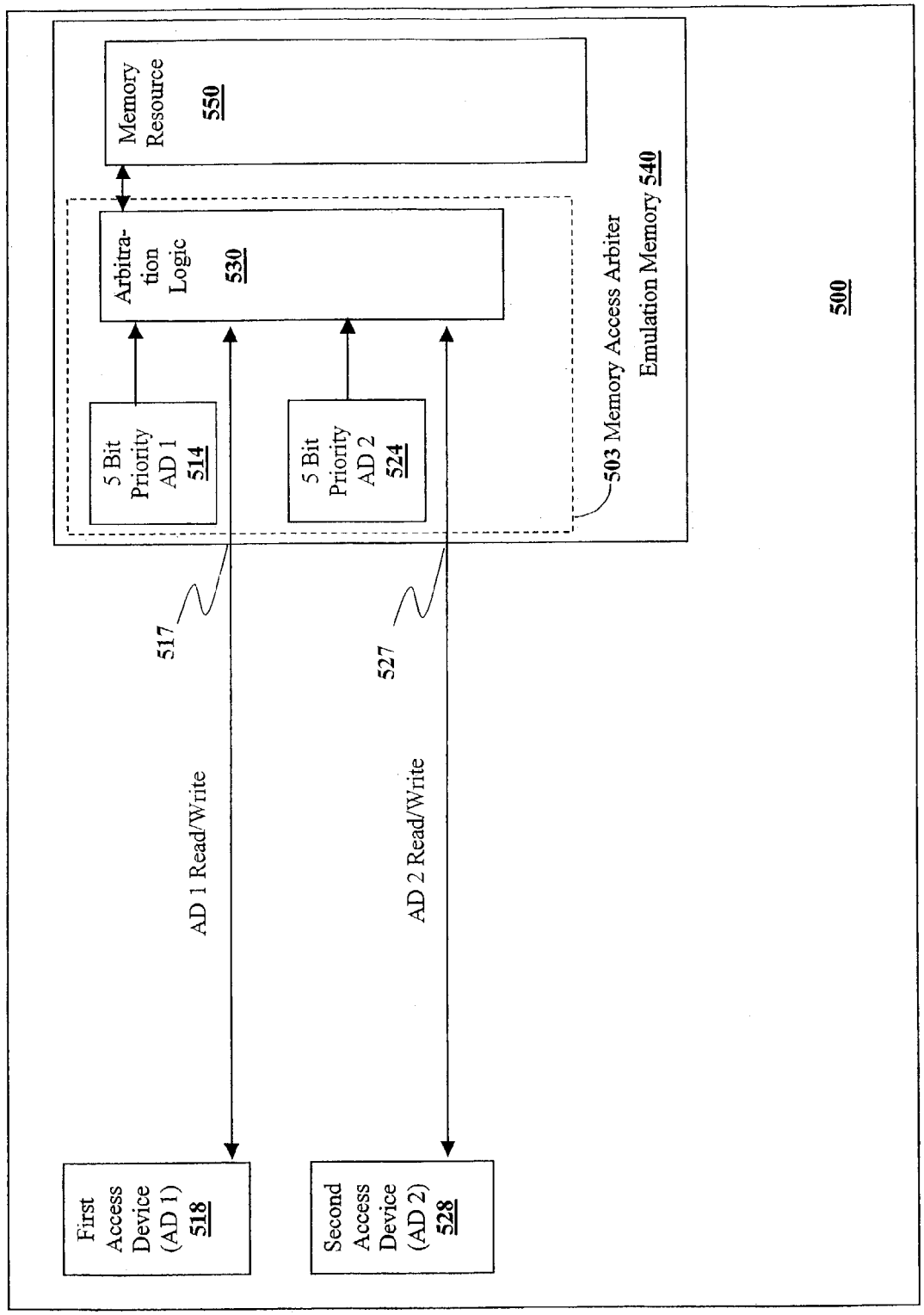
FIG. 5 is a functional block diagram of an illustrative emulation integrated circuit including a memory resource, in accordance with at least one aspect of the invention.

FIG. 5 illustrates a block diagram of illustrative emulation circuitry 500 including an emulation memory 540. In some embodiments, the emulation circuitry 500 may be implemented as an integrated circuit. Two sets of reconfigurable logic resources are configured to represent access devices 518 and 528. (While reconfigurable interconnect resources are used to interconnect devices described in the following discussions, for simplicity of the drawings, FIGS. 1-8 do not explicitly show the reconfigurable interconnect.) The emulation memory 540 includes priority registers 514, 524 arbitration logic 530, which together embody a memory access arbitration 503. In operation, during an emulation cycle, an access request for the memory resource 550 may be generated by both the first access device 518 and the second access device 528. Both access devices 518 and 528 in this example are members of a same timing domain on an integrated circuit 500. Assume that, the first access device 518 has a timing requirement that data to be read from the memory resource 550 be available at a first time, and that the second access device 528 has a timing requirement that data to be read from the memory resource 550 be available at a second time later than the first time. As a result, a memory access arbiter 530 is configured by emulation control software to arbitrate memory requests in a manner such that the first access device 518 has a higher priority level associated with the memory resource 550 than does the second access device 528. The control software may be embodied in the form of a computer-readable medium, such as but not limited to a magnetic tape, floppy disk, hard disk drive, CD-ROM, flash memory card.

In this embodiment, the priority registers 514 and 524 and each five bits deep. However, the may be of any size. The priority registers 514 and 524 are associated with input ports 517 and 527, respectively, to the emulation memory 540. The five bit priority registers 514 and 524 allow any of 32 (in this example, since $2^5=32$) different priority levels to be assigned by the memory access arbiter 503 for each access device 518 and 528. The priority registers 514 and 524 may be configured in a number of ways. In one embodiment, the priority registers 514 and 524 are programmed by system software that configures the emulation system having the emulation memory 540. In such a case, the priority level of the first access device 518 and the priority level of the second access device 528 are known at compilation time by the system software. As a result, the effective priority levels stored in priority register 514 and the priority register 524 reflect a corresponding priority configuration. In this embodiment, if a priority register is programmed with a higher effective priority level than that of another access device, then the access device corresponding to the priority register and having the higher effective priority level is granted access first to the memory resource 550 based on the higher priority level.

Figure 6:
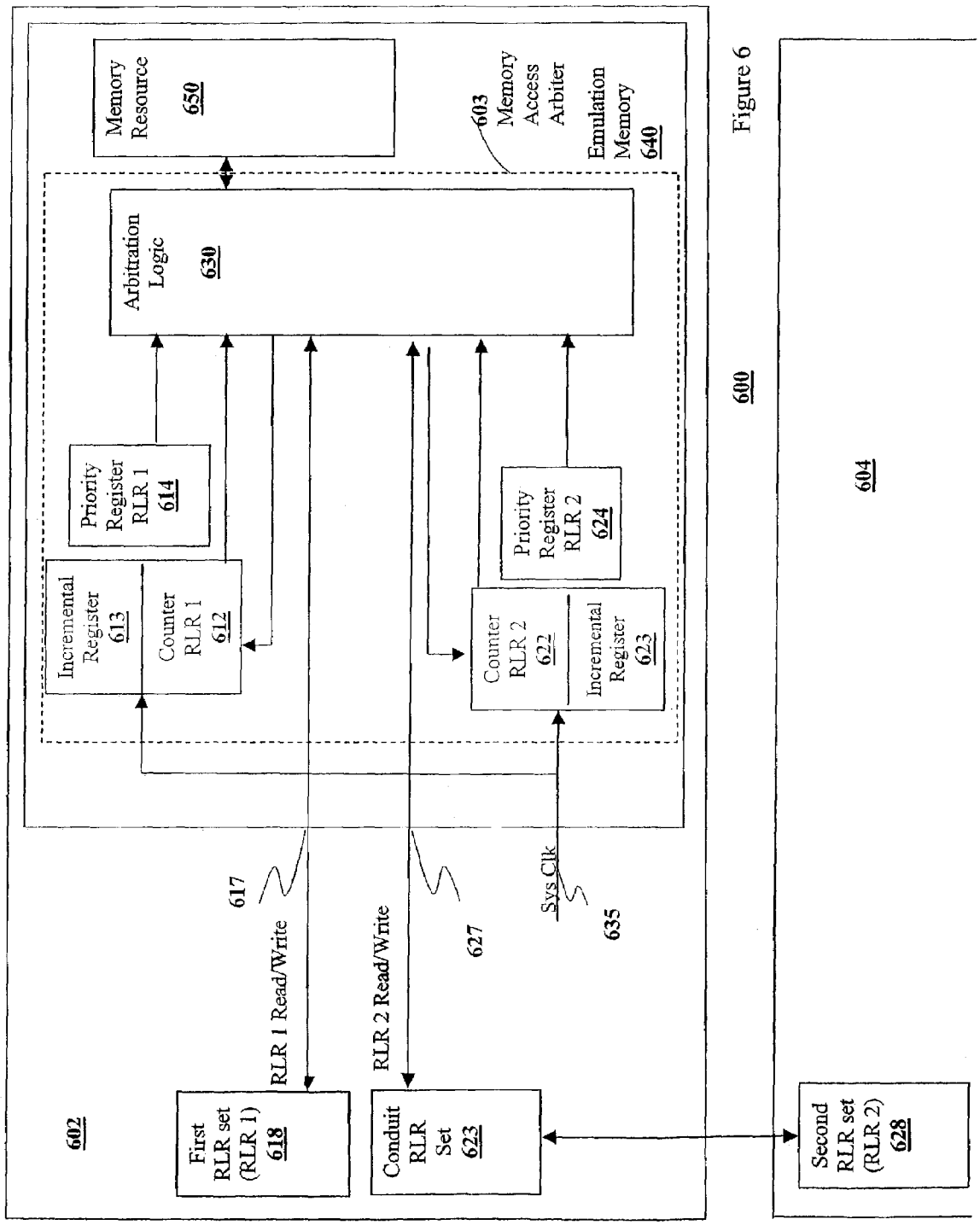
FIG. 6 is a functional block diagram of an illustrative multiple clock domain configuration of an emulation system with embedded memory, in accordance with at least one aspect of the invention.

FIG. 6 shows a block diagram of a multiple clock domain configuration of an emulation system with embedded memory, in accordance with one embodiment. In this embodiment, an emulation board 600 is shown with integrated circuit devices 602 and 604. The integrated circuit devices 602 and 604 have reconfigurable logic resources configured to emulate one or more logic devices in different time domains. In this embodiment, an emulation memory 640 includes arbitration logic 630 for arbitrating access to a memory resource 650. The emulation memory 640 also includes priority registers 614 and 624 for arbitrating access requests from the same timing domain. In this embodiment, the emulation memory 640 services a first set of reconfigurable logic resources 618 emulating circuitry in the same timing domain of integrated circuit 602 as the emulation memory 640.

In this embodiment, in addition to servicing a first set of reconfigurable logic resources 618 in the same time domain and in the integrated circuit 602, the emulation memory 640 may service a second set of reconfigurable logic resources 628. This second set of reconfigurable logic resources 628 resides in the integrated circuit 604, which is part of a second time domain. In this embodiment, a third set of reconfigurable logic resources 623 in integrated circuit 602 acts as a conduit. The conduit 623 provides additional interconnect resources to allow access to the memory resource 640 from the set of reconfigurable logic resources 628 existing outside of the integrated circuit 602. In another embodiment, the second set of reconfigurable logic resources 628, corresponding to the second timing domain, are routed directly to the emulation memory 640 without the use of a conduit set of reconfigurable logic resources. In the embodiment shown in FIG. 6, when arbitrating between sets of reconfigurable logic resources from different timing domains, the priority registers 614 and 624 are not used to favor access to the memory resource 650. In another embodiment, where priority levels are used to favor access to one of two sets of reconfigurable logic resources to the memory resource 650, the priority registers 614 and 624 are initialized to an identical value. In the case of identical priority levels, the arbitration logic 630 may utilize one or more other criteria to arbitrate accesses and break the tie.

In the embodiment shown in FIG. 6, in the case of multiple time domain requests, a service time indicator may be utilized by the arbitration logic 630 to further arbitrate access to the memory resource 650. In this embodiment, counters 612 and 622 are used to provide a service time criterion. Similar to the priority registers 614 and 624, each counter 612 and 622 corresponds to a port of the emulation memory 640. The emulation memory 640 includes the first counter 612 associated with the first set of reconfigurable logic resources 618 through a first port 617. The emulation memory 640 also includes the second counter 622 associated with the second set of reconfigurable logic resources 628, in a separate time domain, through a second port 627. When an access request is received at the first port 617, the arbitration logic 630 initializes the first counter 612 with an initial value. Similarly, when an access request is received at the second port 627, the arbitration logic 630 initializes the second counter 622 with a corresponding initial value.

In various embodiments, differing schemes may be used to determine initial values for the counters 612 and 622. In one embodiment, system software responsible for the operation of an emulation system, including the emulation board 600, configures the arbitration logic 630 with different initial values for each counter 612 and 622. In another embodiment, the counters 612 and 622 are each initialized to a same value by the arbitration logic 630. In one embodiment, the initial value of the second counter 622 has a higher initial count than the first counter 612, enabling an access request through the port 627 from the second timing domain to receive preferential treatment vis-a-vis an access request through the port 617 from the same timing domain as the emulation memory 640.

After the counters 612 and 622 are initialized, the counters 612 and/or 622 are deterministically incremented. In the exemplary embodiment, each counter 612 and 622 continues to be incremented until an associated access request is granted. For example, as shown in FIG. 6, the counters 612 and 622 are incremented using a system clock 635. Thus, for each cycle of the system clock 635, the counters 612 and 622 increase by a same amount. In one embodiment, the emulation memory 640 is configured by the system software so that the counters 612 and 622 are incremented by a single value for each cycle of the system clock 635. In a variation of the embodiment, the counters 612 and 622 are incremented by different values. For example, the counter 622 (that is associated with the second time domain), may increment at double the rate of the counter 612 (that is associated with the first time domain). When different values are used to increment the counters 612 and 622, counters 612 and 622 may be associated with incremental registers 613 and 623, respectively. In the embodiment, corresponding values of the incremental registers 613 and 623 may be configured by the system software.

When the memory resource 650 becomes available to service an access request, the counters 612 and 622 are checked by the arbitration logic 630. The port corresponding to the counter with the greater value is allowed access to the memory resource 650. The counter corresponding to the port for which the requested access is granted stops counting. However the counters corresponding to all remaining ports with access requests that have not been serviced continue counting. When the memory resource 650 finishes servicing the current access request, the above-described process repeats with the port having the remaining highest current counter value (as determined by the arbitration logic 630) being serviced by the memory resource 650. Alternatively, in other embodiments, a counter, corresponding to a port being granted access, may continue to increment and reset only at the end of an emulation cycle (i.e. a user cycle).

Figure 7:
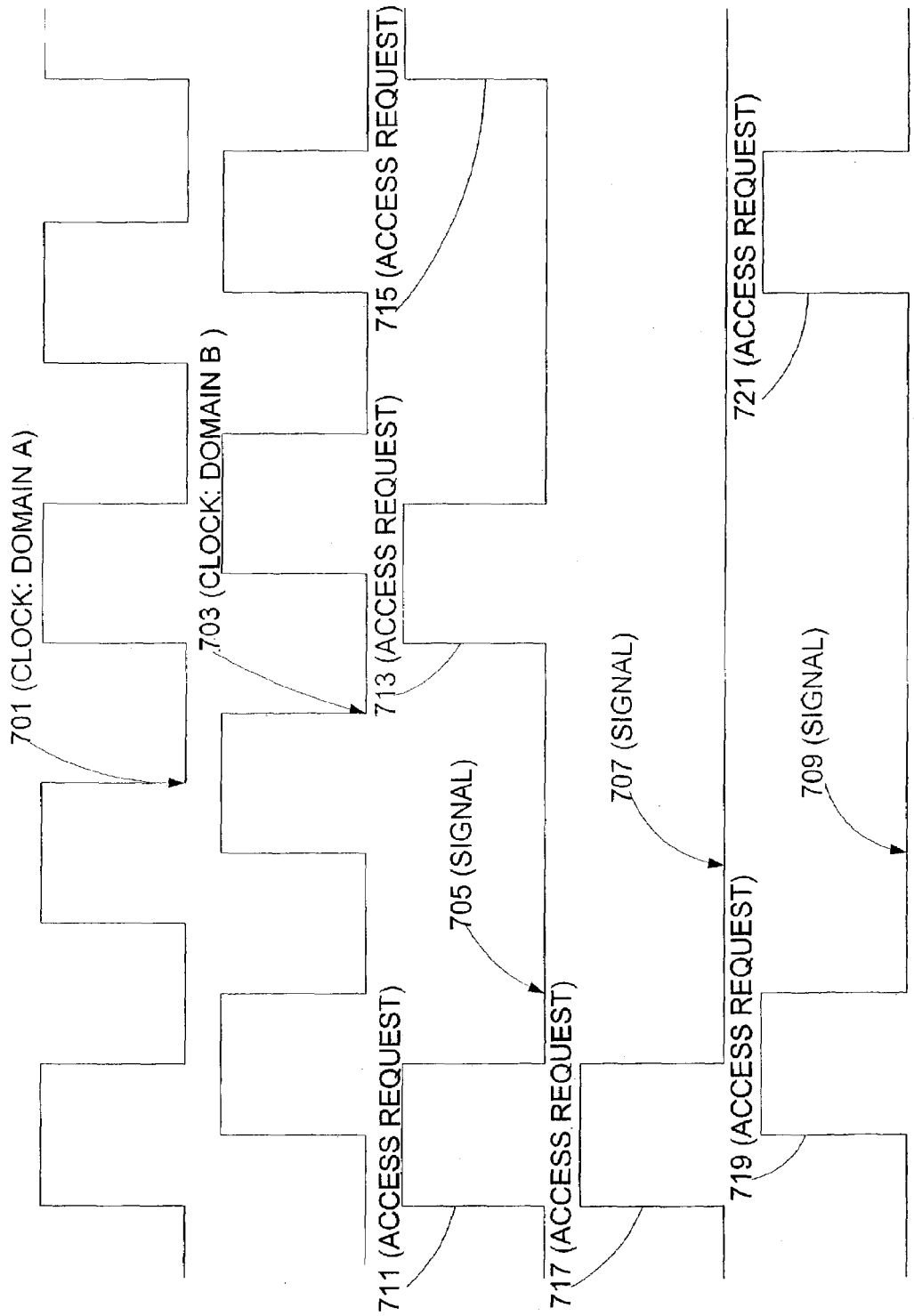
FIG. 7 is a an illustrative timing diagram for clocks that are associated with different timing domains and for generated signals that are derived from the clocks in accordance with at least one aspect of the invention.

FIG. 7 shows a timing diagram for clocks 701 and 703 that reside in different timing domains and for generated signals 705, 707, and 709 that are derived from the clocks 701 and 703 in accordance with an embodiment of the invention. In general, the clock rates for clocks 701 and 703 may be approximately equal, may be different, may have a phase offset with respect to each other, and/or may operate asynchronously with respect to each other. The signals 705 and 707 originate in timing domain A and the signal 709 originates in timing domain B. Each of signals 705, 707, and 709 are inputted to an arbitration logic (e.g. the arbitration logic 630 as shown in FIG. 6) through corresponding ports. The signals 705, 707, and 709 convey access requests (write or read) for a memory resource (e.g. memory resource 650 as shown in FIG. 6). During a time interval that is spanned as shown in FIG. 7, access requests 711, 713, and 715 (as conveyed by the signal 705), an access request 717 (as conveyed by the signal 707), and access requests 719 and 721 (as conveyed by the signal 709) are presented to the arbitration logic. The arbitration logic grants access in accordance with the corresponding priority levels.

A priority level for a set of reconfigurable logic resources may be determined in accordance with access characteristics of the set of reconfigurable logic resources and an emulated logic element. For example, a higher priority level may be assigned to a set of reconfigurable logic resources having a faster clock rate. A faster clock rate is indicative of a smaller time interval between memory accesses, i.e. the timing requirements are more stringent. Also, a shorter time interval between consecutive access requests and a greater number of access requests by a set of reconfigurable logic resources may indicate a higher priority level.

Figure 8:
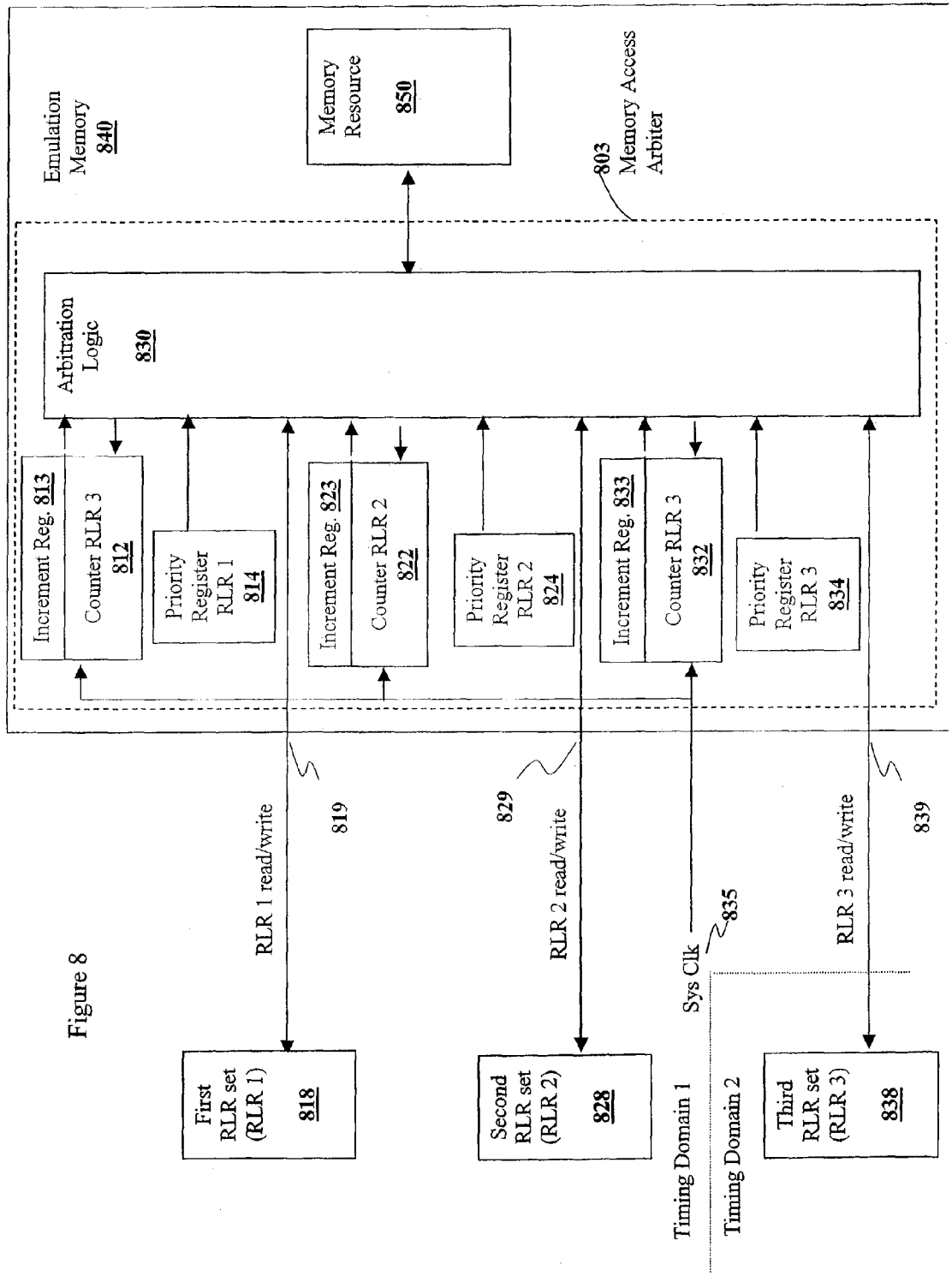
FIG. 8 is a functional block diagram illustratively showing a memory resource servicing three sets of reconfigurable logic resources, in accordance with at least one aspect of the invention.

FIG. 8 illustrates an emulation memory 840 servicing sets of reconfigurable logic resources 818, 828, and 838, in accordance with one embodiment. Each set of reconfigurable logic resources 818, 828, and 838 is configured to emulate at least one logic element of an electronic circuit. In addition, each set of reconfigurable logic resources 818, 828, and 838 is coupled to a memory resource 850 by way of an arbitration logic 830 and reconfigurable interconnect logic (not shown). The arbitration logic 830 is configured to arbitrate and serialize access to the memory resource 850 by the set of reconfigurable logic resources 818, 828, and 838 in an emulation cycle. Arbitration is performed by configuring corresponding priority levels for the sets of reconfigurable logic resources 818, 828, and 838. The priority configuration may be reflective of the timing requirements of the reconfigurable logic resources and/or the timing characteristics of the logic elements that the reconfigurable logic resources are configured to emulate.

In another embodiment, the first set of reconfigurable logic resources 818 and second set of reconfigurable resources 828 are configured to emulate logic elements residing in a first timing domain. Because sets 818 and 828 reside in the same time domain, the emulation system may utilize the timing requirements of the emulation resources emulating the logic elements accessing the memory resource 850. For example, system software (that may make the determination as to the timing requirements) may account for the timing relationship between the first and second sets of reconfigurable logic resources 818 and 828. From this timing information, the system software may determine which set of reconfigurable logic resources requires access to the memory resource 850 before the other set of reconfigurable logic resources. In this manner, the system software, during configuration time of a memory access arbiter 803, may configure the memory access arbiter 803 to favor the set of reconfigurable logic resources requiring an earlier data access. In this embodiment, the third reconfigurable logic resource set 838 resides in a second timing domain. Unlike timing requirements for a single timing domain, relative timing requirements for reconfigurable logic resources across different timing domains might not be ascertainable deterministically. As a result, it may not be desirable to configure the arbiter 803 to favor the reconfigurable logic resources of one timing domain over that of another timing domain. In the embodiment illustrated in FIG. 8, the memory resource 850 resides in the first timing domain. However, in another embodiment, the memory resource 850 may reside in a third timing domain different from the first and second domains.

In one embodiment, the sets of reconfigurable logic resources 818, 828, and 838 are connected, through a reconfigurable interconnect (not shown), to a first port 819, a second port 829, and a third port 839 of an emulation memory 840, respectively. In this embodiment, the first port 819, the second port 829, and the third port 839 of the emulation memory 840 are associated with a first 814 priority register, a second priority register 824, and a third priority register 834, respectively. The first priority register 814 and the second priority register 824 are configured with priority levels that are based on the deterministic timing requirements of both sets 818 and 828, as previously discussed. The third priority register 834 is configured with an priority level of one of the two priority values for the first priority register 814 and the second priority register 824. In this embodiment, a service time indicator (as will be explained) is further utilized by the arbitration logic 830 to arbitrate access to the memory resource 850.

In one embodiment, the ports 819, 829, 839 of the emulation memory 840 are associated with counters 812, 822, 832, respectively. In this embodiment, when an access request is received by a port from a corresponding set of reconfigurable logic resources, the corresponding counter is initialized with an initial value. In various embodiments, there are a variety of methods of configuring the initial values of the counters. In the embodiment, the counters 812, 822, and 832 are initialized to a different value. System software may configure the memory access arbiter 803 with an initial value for each counter. (In another embodiment, the system software configures the memory access arbiter 803 to use a single initial value for every counter.) After initialization, each counter is then deterministically incremented. In one embodiment, each counter is incremented by a same amount on every rising edge of a system clock 835. The amount to increment each counter is provided to the memory access arbiter 803 by the system software upon configuration of the memory access arbiter 803. Alternatively, each counter 812, 822, and 832 is incremented by a different amount. The present embodiment, incremental registers 813, 823 and 833 correspond to the counters 812, 822, and 832, respectively. The memory access arbiter 803 is configured with the incremental amounts for each counter by the system software. The incremental amounts are then stored in the corresponding incremental register. Alternatively, two of the three counters are incremented with a first value and the third counter is incremented with a second value. When the memory resource 850 is ready to service a next access request, the counter values of each port with a pending access request are used to determine which port is serviced next by the memory resource 850.

The priority registers 814, 824, and 834 and the corresponding counter values, may be used to determine a composite priority level for an access request. For example, both a priority register and a counter register are implemented. A five-bit priority (or other size) register may be used for determining a base priority level. An 11-bit counter may also used be to track a service time indicator as previously discussed. In this embodiment, the priority register is combined with the service time indicator to provide a composite priority level for an access request received at a corresponding port. For example, an 11-bit adder may be used to sum the priority register and the counter register. This sum would be the priority level that is used to determine which set of reconfigurable logic resources is to be serviced next by the memory resource 850.

Figure 9:
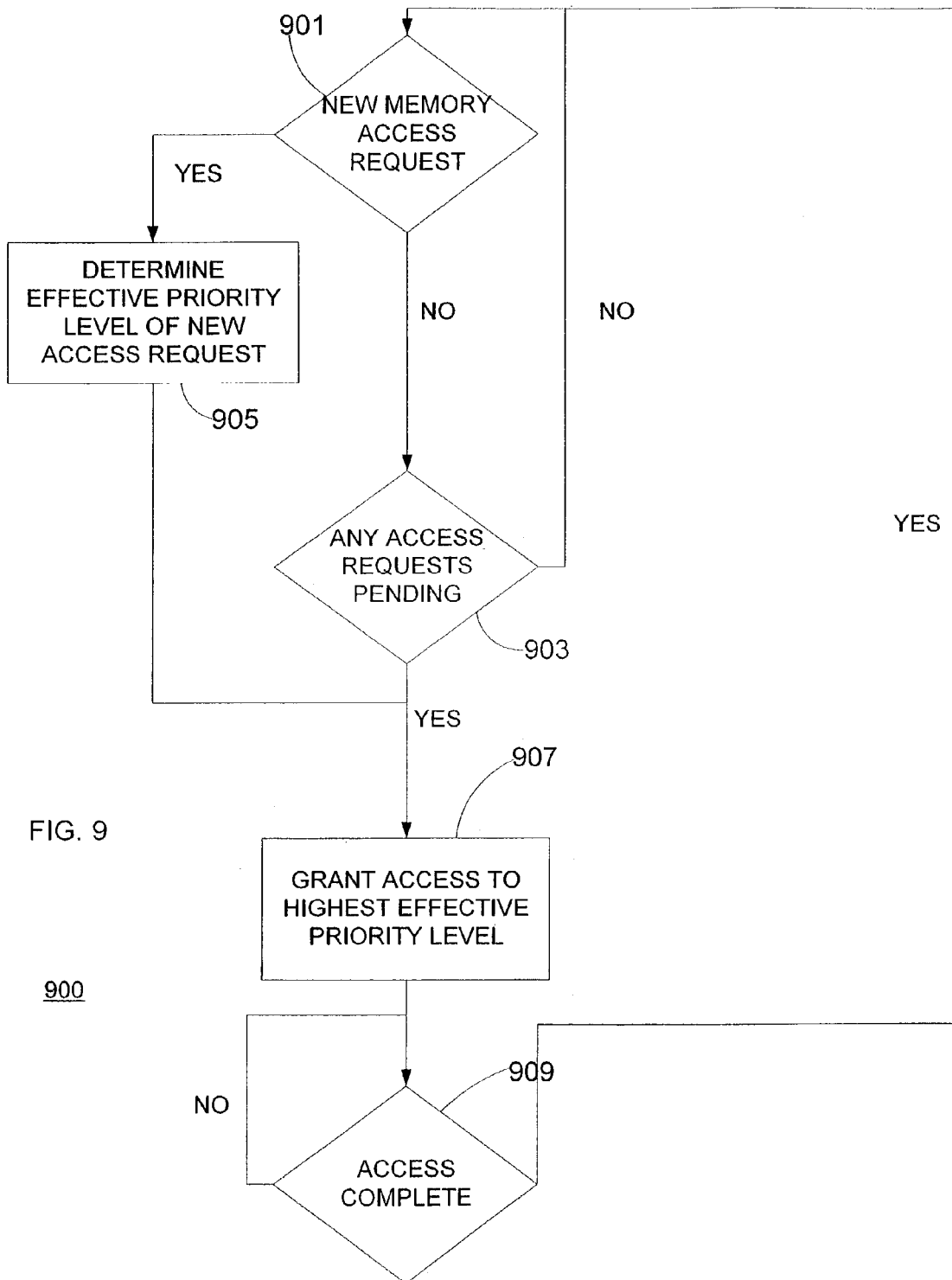
FIG. 9 is a flow diagram showing illustrative steps for arbitrating memory access requests in accordance with at least one aspect of the invention.

FIG. 9 shows a flow diagram 900 for arbitrating memory access requests in accordance with an illustrative embodiment of the invention. In step 901, it is determined whether a new memory access request is generated by a set of reconfigurable logic resources. If so, a priority level for the new memory access request is determined in step 905. If a new memory access request has not been generated, then step 903 determines whether any access requests are pending. In step 907, the access request corresponding to the highest priority level is granted. When the access has completed, as determined in step 909, steps 901-907 are repeated.

Figure 10:
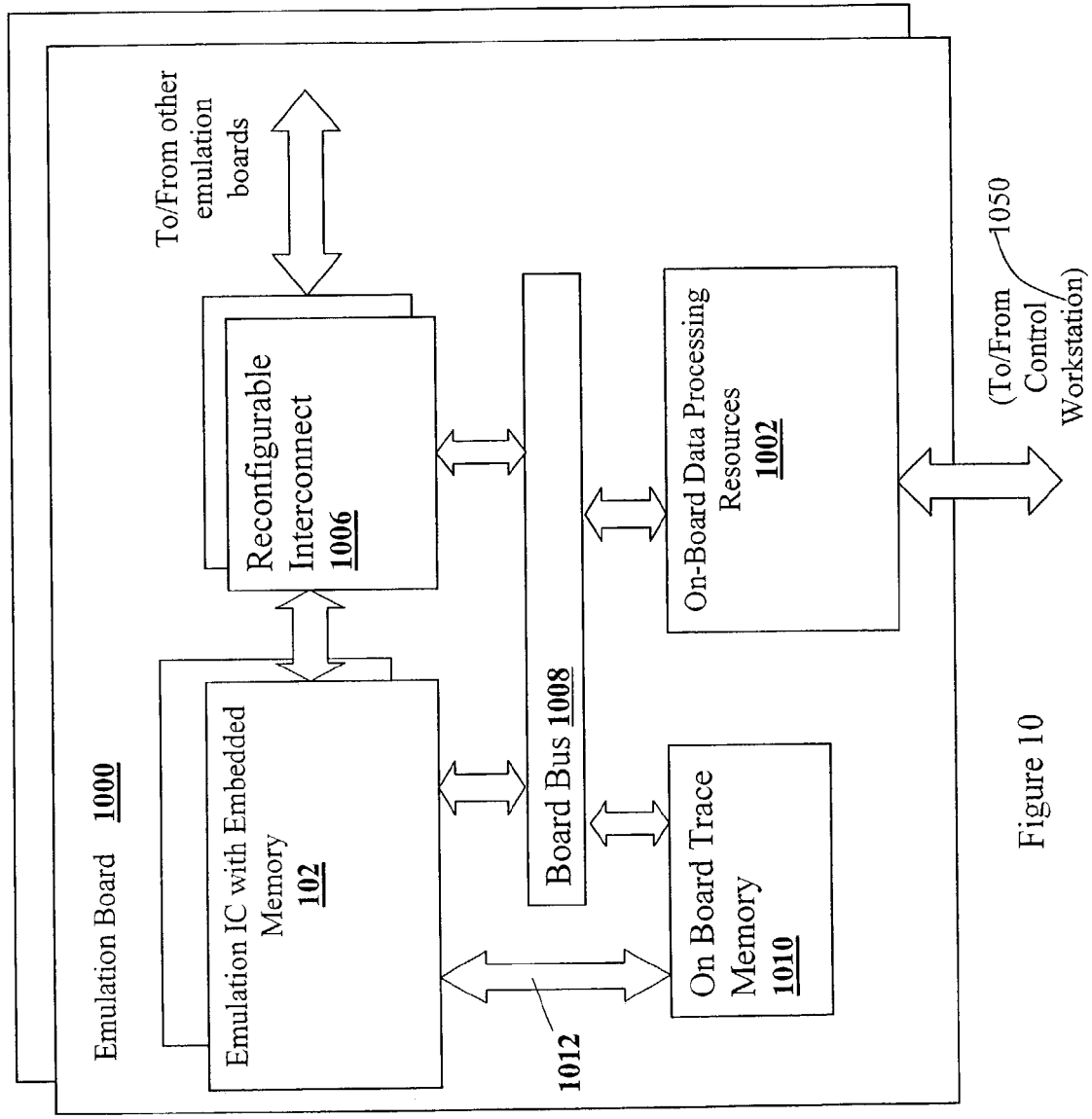
FIG. 10 is a functional block diagram of an illustrative emulation board utilizing integrated circuits comprising memory access arbiter, in accordance with at least one aspect of the invention.

FIG. 10 illustrates a block diagram of an emulation board 1000 utilizing integrated circuits comprising memory access arbiters, in accordance with an illustrative embodiment. As shown, for the illustrated embodiment, the emulation board 1000 includes on-board data processing resources 1002, on-board emulation ICs 102, an on-board reconfigurable interconnect 1006, an on-board bus 1008, and an on-board trace memory 1010 coupled to each other as shown (i.e. through the on-board bus 1008). Additionally, the on-board emulation ICs having embedded memory resources 102 are directly coupled to an on-board trace memory 1010. The emulation board 1000 further includes a number of I/O pins (not illustrated). A first subset of I/O pins may be employed to couple selected outputs of the reconfigurable interconnect 1006 to reconfigurable interconnects of other logic boards (thereby coupling the emulation memory devices of the logic boards). A second subset of I/O pins may be employed to couple the on-board data processing resources 1002 to designated control memory devices, such as a control workstation 1050.

Figure 11:
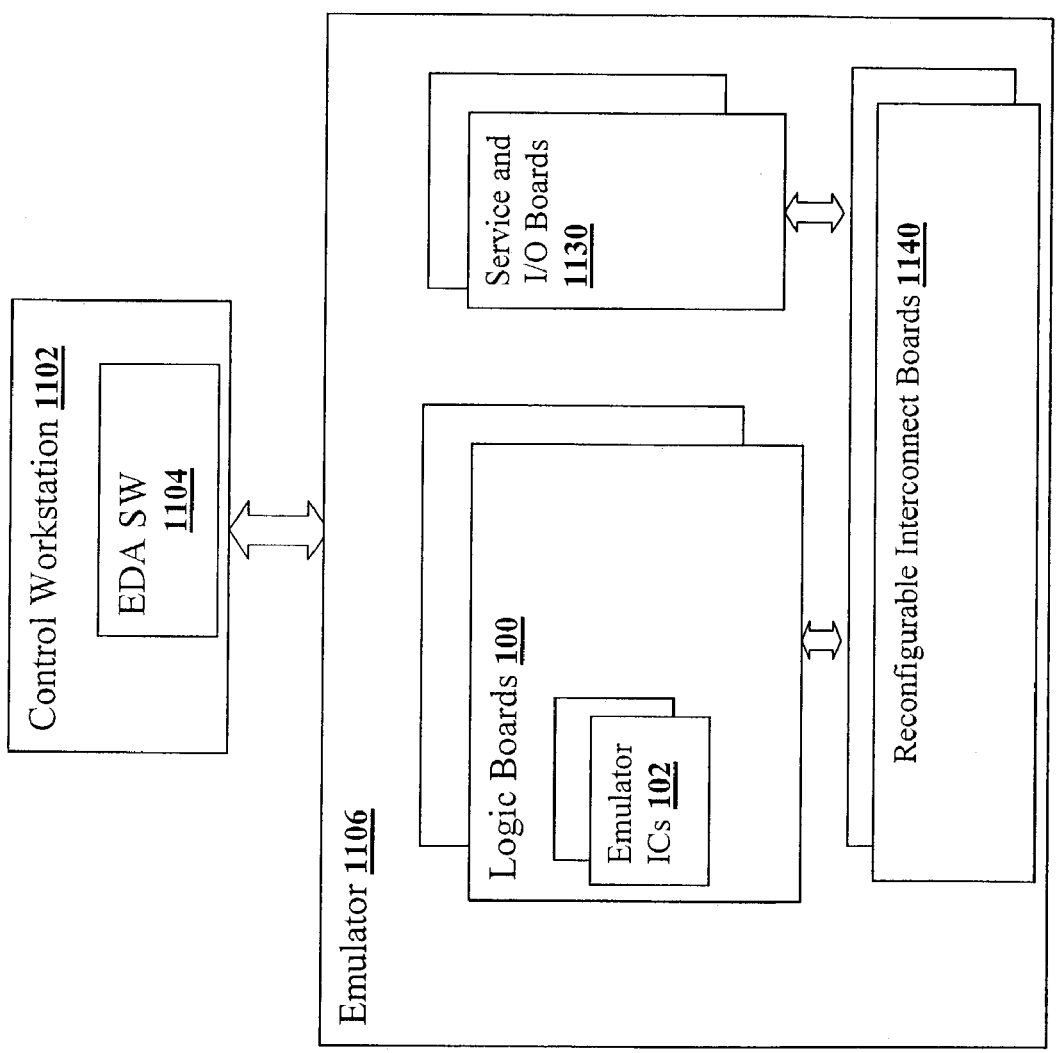
FIG. 11 is a functional block diagram of an illustrative emulation system in accordance with at least one aspect of the invention.

FIG. 11 illustrates an emulation system in accordance with an illustrative embodiment of the present invention. Emulator 1106 includes logic boards 100, reconfigurable interconnect boards 1140, and service and I/O boards 1130. The emulator 1106 includes communications memory devices for communicating with a control workstation 1102. The control workstation 1102 includes electronic design automation (EDA) software 1104 responsible for communicating with and configuring elements of the emulator 1106, including memory access arbiters in accordance with the present invention. For example, the software 1104 may determine an effective priority level for a set of reconfigurable logic resources in accordance with access characteristics of the set of reconfigurable logic resources and an emulated logic element. In the present embodiment, the software 1104 configures the emulator 1106 for an emulation cycle, although other embodiments may dynamically configure the emulator 1106 during the emulation cycle.

While illustrative systems and methods as described herein embodying various aspects of the present invention are shown by way of example, it will be understood that the invention is not limited to these embodiments. Modifications may be made by those skilled in the art, particularly in light of the foregoing teachings. For example, each of the elements of the aforementioned embodiments may be utilized alone or in combination with elements of the other embodiments. In addition, the invention has been defined using the appended claims, however these claims are illustrative in that the invention is intended to include the elements and steps described herein in any combination or sub combination. It will also be appreciated and understood that modifications may be made without departing from the true spirit and scope of the invention. In addition, aspects of the present invention may be embodied in the form of program code, wherein when the program code is loaded into and executed by a computer, the computer becomes an apparatus for practicing aspects of the invention.

What is claimed is:

1. A method for emulating an electronic circuit design, comprising steps of:
   (a) receiving a first access request from a first set of reconfigurable logic resources and a second access request from a second set of reconfigurable logic resources, the first set of reconfigurable logic resources and the second set of reconfigurable logic resources configured to emulate at least a first logic element and at least a second logic element of the electronic circuit design, respectively;
   (b) determining one of first or second sets of reconfigurable logic resources that is associated with a highest priority level of the first and second sets of reconfigurable logic resources, the highest priority level being based on a timing requirement; and
   (c) granting access to a memory resource to said one of the first or second sets of reconfigurable logic resources having the highest priority level, the memory resource configured to emulate an in-circuit memory element.

2. The method of claim 1, further comprising a step of:
   (d) configuring reconfigurable interconnect resources to interconnect the first set of reconfigurable logic resources and the second set of reconfigurable logic resources to the memory resource.

3. The method of claim 1, wherein the first logic element and the second logic element are associated with a same timing domain of the electronic circuit design.

4. The method of claim 1, wherein the first logic element and the second logic element are associated with different timing domains.

5. The method of claim 4, wherein the first set of reconfigurable logic resources and the second of reconfigurable logic resources are associated with a same emulation integrated circuit.

6. The method of claim 1, further comprising a step of:
   (d) assigning a priority level to each of the first and second sets of reconfigurable logic resources.

7. The method of claim 6, wherein (d) is performed for each of a plurality of emulation clock cycles.

8. A method for emulating an electronic circuit design, comprising steps of:
   (a) receiving a first access request from a first set of reconfigurable logic resources and a second access request from a second set of reconfigurable logic resources, the first set of reconfigurable logic resources and the second set of reconfigurable logic resources configured to emulate at least a first logic element and at least a second logic element of the electronic circuit design, respectively;
   (b) determining one of first or second sets of reconfigurable logic resources that is associated with a highest priority level of the first and second sets of reconfigurable logic resources, by
   determining the highest priority level based on timing characteristics of the first set of reconfigurable logic resources and the second set of reconfigurable logic resources; and
   (c) granting access to a memory resource to said one of the first or second sets of reconfigurable logic resources having the highest priority level, the memory resource configured to emulate an in-circuit memory element.

9. A method for emulating an electronic circuit design, comprising steps of:
   (a) receiving a first access request from a first set of reconfigurable logic resources and a second access request from a second set of reconfigurable logic resources, the first set of reconfigurable logic resources and the second set of reconfigurable logic resources configured to emulate at least a first logic element and at least a second logic element of the electronic circuit design, respectively;
   (b) determining one of first or second sets of reconfigurable logic resources that is associated with a highest priority level of the first and second sets of reconfigurable logic resources, by
   determining the highest priority level based on timing characteristics of the first logic element and the second logic element; and
   (c) granting access to a memory resource to said one of the first or second sets of reconfigurable logic resources having the highest priority level, the memory resource configured to emulate an in-circuit memory element.

10. A method for emulating an electronic circuit design, comprising steps of:
    (a) receiving a first access request from a first set of reconfigurable logic resources and a second access request from a second set of reconfigurable logic resources, the first set of reconfigurable logic resources and the second set of reconfigurable logic resources configured to emulate at least a first logic element and at least a second logic element of the electronic circuit design, respectively;
    (b) determining one of first or second sets of reconfigurable logic resources that is associated with a highest priority level of the first and second sets of reconfigurable logic resources,
    wherein a first timing requirement is associated with the first set of reconfigurable logic resources and a second timing requirement is associated with the second set of reconfigurable logic resources, the first and second timing requirements further being associated with accessing data from a memory resource, and the first timing requirement is more stringent than the second timing requirement, the step (b) further including favoring the first access request over the second access request; and
    (c) granting access to the memory resource to said one of the first or second sets of reconfigurable logic resources having the highest priority level, the memory resource configured to emulate an in-circuit memory element.

11. The method of claim 10, further including a step of:
    configuring a first register with a first priority indicator and a second register with a second priority indicator, the first register being associated with the first set of reconfigurable logic resources and the second register being associated with the second set of reconfigurable logic resources, the first priority indicator being indicative of a higher priority level with respect to the second priority indicator.

12. A method for emulating an electronic circuit design, comprising steps of:
    (a) receiving a first access request from a first set of reconfigurable logic resources and a second access request from a second set of reconfigurable logic resources, the first set of reconfigurable logic resources and the second set of reconfigurable logic resources configured to emulate at least a first logic element and at least a second logic element of the electronic circuit design, respectively;

(b) determining a first service time indicator that is associated with the first set of reconfigurable logic resources and a second service time indicator that is associated with the second set of reconfigurable logic resources;

(c) determining one of first or second sets of reconfigurable logic resources that is associated with a highest priority level of the first and second sets of reconfigurable logic resources, the highest priority level being based on relative timing requirements indicated by the first service time indicator and the second service time indicator; and (d) granting access to a memory resource to said one of the first or second sets of reconfigurable logic resources having the highest priority level, the memory resource configured to emulate an in-circuit memory element.

13. The method of claim 12, wherein (c) further comprises:

obtaining a first priority indicator from a first register that is associated with the first set of reconfigurable logic resources and a second priority indicator from a second register that is associated with the second set of reconfigurable logic resources; and combining the first priority indicator with the first service time indicator forming a first combined indicator and combining the second priority indicator with the second service time indicator forming a second combined indicator to determine the highest priority level, the highest priority level being based on relative values of the first combined indicator and the second combined indicator.

14. The method of claim 12, wherein (b) comprises:

(1) determining the first service time indicator from a first counter that is associated with the first set of reconfigurable logic resources; and (2) determining the second service time indicator from a second counter that is associated with the second set of reconfigurable logic resources.

15. The method of claim 14, wherein (1) comprises incrementing the first counter until the first access request is granted, and (2) comprises incrementing the second counter until the second access request is granted.

16. The method of claim 14, wherein (1) comprises initializing the first counter to a first initial value, and (2) comprises initializing the second counter to a second initial value.

17. The method of claim 16, wherein the first initial value equals the second initial value.

18. The method of claim 14, wherein (1) comprises incrementing the first counter by a first incremental amount, and (2) comprises incrementing the second counter by a second incremental amount.

19. An apparatus for emulating an electronic circuit design, the apparatus comprising:

a plurality of sets of reconfigurable logic resources that are each reconfigurable to emulate a logic element of the electronic circuit design and that are each associated with a priority level, the priority level being based on a timing requirement; and an emulation memory comprising:

a memory resource that is allocable to emulate an in-circuit memory element of the electronic circuit design; and a memory access arbiter, the memory access arbiter comprising arbitration logic configured to determine and grant one of the sets of reconfigurable logic resources access to the memory resource in accordance with a highest one of the priority levels.

20. The apparatus of claim 19, wherein the plurality of sets of reconfigurable logic resources and the emulation memory are both on a same integrated circuit.

21. The apparatus of claim 19, wherein the emulation memory includes a plurality of ports, each port being associated with one of the sets of reconfigurable logic resources, the apparatus further including an interconnect arrangement that interconnects each of the sets of reconfigurable logic resources to a respective port of the emulation memory.

22. The apparatus of claim 19, wherein the memory access arbiter further comprises a plurality of registers, each register configured to store a priority indicator that is associated with a respective one of the sets of reconfigurable logic resources, the priority levels being based on values of the priority indicators.

23. An apparatus for emulating an electronic circuit design, the apparatus comprising:

a plurality of sets of reconfigurable logic resources that are each reconfigurable to emulate a logic element of the electronic circuit design and that are each associated with a priority level; and an emulation memory comprising:

a memory resource that is allocable to emulate an in-circuit memory element of the electronic circuit design; and a memory access arbiter, the memory access arbiter comprising arbitration logic configured to determine and grant one of the sets of reconfigurable logic resources access to the memory resource in accordance with a highest one of the priority levels, wherein the memory access arbiter further comprises a plurality of incremental registers, each of the incremental registers being associated with a respective one of a plurality of counters, each of the incremental registers configured to store an amount that the respective one of the counters increases for each incremental step, the priority levels being based on values of the counters.

24. An apparatus for emulating an electronic circuit design, the apparatus comprising:

a plurality of sets of reconfigurable logic resources that are each reconfigurable to emulate a logic element of the electronic circuit design and that are each associated with a priority level; and an emulation memory comprising:

a memory resource that is allocable to emulate an in-circuit memory element of the electronic circuit design; and a memory access arbiter, the memory access arbiter comprising arbitration logic configured to determine and grant one of the sets of reconfigurable logic resources access to the memory resource in accordance with a highest one of the priority levels, wherein the memory access arbiter is further configured to combine a priority indicator and a service time indicator to form a combined indicator, to determine the highest priority level, the highest priority level being based on a value of the combined indicator.

25. The apparatus of claim 24, wherein the memory access arbiter includes an adder configured to combine the priority indicator with the service time indicator.

26. A system for emulating an electronic circuit design, the system comprising:
- a plurality of sets of reconfigurable logic resources that are reconfigurable to emulate a plurality of logic elements of the electronic circuit design;
- a memory resource that is allocable to emulate in-circuit memory element of the electronic circuit design;
- a memory access arbiter, the memory access arbiter comprising arbitration logic configured to determine and grant one of the sets of reconfigurable logic resources access to the memory resource in accordance with a highest priority level of the plurality of sets of reconfigurable logic resources; and
- a control workstation coupled to the sets of reconfigurable logic resources and is configured to program the sets of reconfigurable logic resources to emulate the electronic circuit design, the control workstation further being configured to assign a priority level to each of the sets of reconfigurable logic resources, the priority level being based on a timing requirement.

* * * * *